United States Patent
Salmi

(10) Patent No.: US 6,559,020 B1
(45) Date of Patent: May 6, 2003

(54) BIPOLAR DEVICE WITH SILICON GERMANIUM (SIGE) BASE REGION

(75) Inventor: Abderrahmane Salmi, Temecula, CA (US)

(73) Assignee: Applied Micro Circuits Corporation, San Diego, CA (US)

( * ) Notice: Subject to any disclaimer, the term of this patent is extended or adjusted under 35 U.S.C. 154(b) by 0 days.

(21) Appl. No.: 09/421,957

(22) Filed: Oct. 20, 1999

(51) Int. Cl.⁷ .............................................. H01L 21/331
(52) U.S. Cl. ...................... 438/312; 320/350; 320/364; 320/739
(58) Field of Search ................................ 438/320, 312, 438/350, 364, 739

(56) References Cited

U.S. PATENT DOCUMENTS

| | | | |
|---|---|---|---|
| 5,204,276 A | * 4/1993 | Nakajima et al. | 438/366 |
| 5,266,504 A | 11/1993 | Blouse et al. | 437/31 |
| 5,340,753 A | 8/1994 | Bassous et al. | 437/31 |
| 5,422,289 A | 6/1995 | Pierce | 437/32 |
| 5,459,084 A | * 10/1995 | Ryum et al. | 438/318 |
| 5,484,737 A | 1/1996 | Ryun et al. | 437/31 |
| 5,503,882 A | 4/1996 | Dawson | 427/579 |
| 5,508,553 A | 4/1996 | Nakamura et al. | 257/576 |
| 5,539,229 A | 7/1996 | Noble, Jr. et al. | 257/301 |
| 5,656,514 A | 8/1997 | Ahlgren et al. | 438/320 |
| 5,668,022 A | 9/1997 | Cho et al. | 438/320 |
| 5,688,703 A | 11/1997 | Klingbeil, Jr. et al. | 437/41 |
| 5,786,039 A | 7/1998 | Brouquet | 427/578 |
| 5,798,277 A | 8/1998 | Ryum et al. | 437/31 |
| 5,861,340 A | 1/1999 | Bai et al. | 438/592 |
| 5,869,354 A | 2/1999 | Leedy | 438/110 |
| 6,080,631 A | * 6/2000 | Kitahata | 438/341 |
| 6,297,091 B1 | * 10/2001 | Roh et al. | 438/256 |

OTHER PUBLICATIONS

Wolf, S., "Silicon Processing for the VLSI Era", vol. 2, pp. 28, 1990.*
Wolf, S. and Tauber, R.N., "Silicon Processing for the VLSI Era", vol. 1, pp. 216–217, 1986.*

* cited by examiner

*Primary Examiner*—Amir Zarabian
*Assistant Examiner*—Christy Novacek
(74) *Attorney, Agent, or Firm*—Gray Cary Ware & Freidenrich; Terrance A. Meador

(57) ABSTRACT

The present invention silicon germanium bipolar device is fabricated by growing a silicon germanium layer on a semiconductor substrate followed by depositing a first oxide layer, a first polysilicon layer, and a first nitride layer on the silicon germanium layer. A well is etched through the first nitride layer and first polysilicon layer, exposing the first oxide layer on the bottom of the well, and the first nitride layer and first polysilicon layer on the side walls of the well. To cover the exposed edges of the first nitride layer and first polysilicon layer along the walls of the well, a second nitride layer is deposited and etched, forming nitride spacers along the sides of the well. The first oxide layer at the bottom of the well area is etched, creating gaps between the silicon germanium and first polysilicon layer. A second polysilicon layer is deposited in the gaps, creating a contact region electrically connecting the first polysilicon layer to the silicon germanium layer. An oxide spacer layer is formed covering the sides of the well. A third polysilicon layer is deposited with a nitride cap in the well and on the second nitride layer and the third polysilicon layer and nitride cap is patterned.

15 Claims, 8 Drawing Sheets

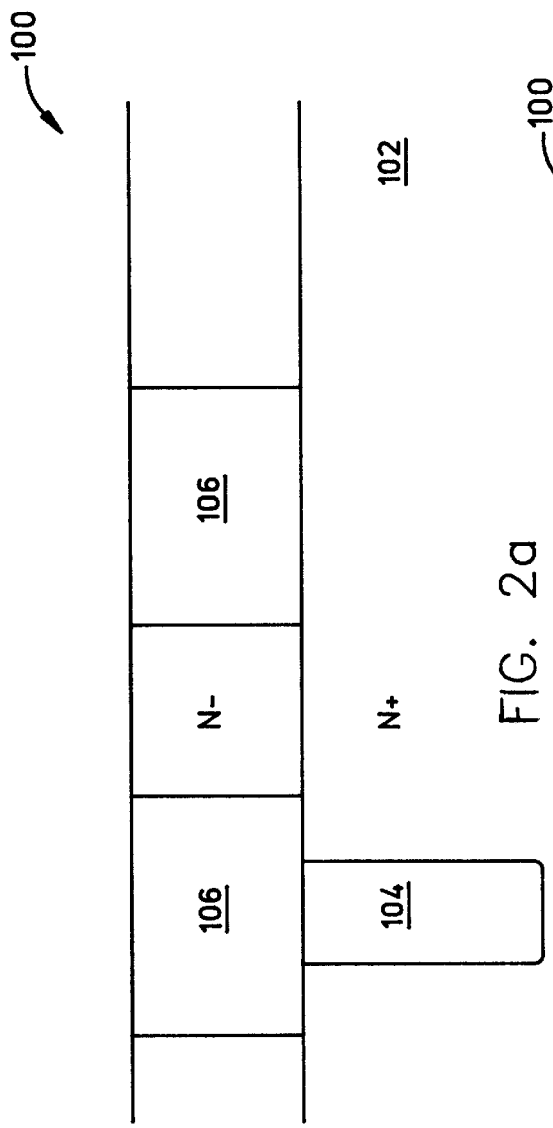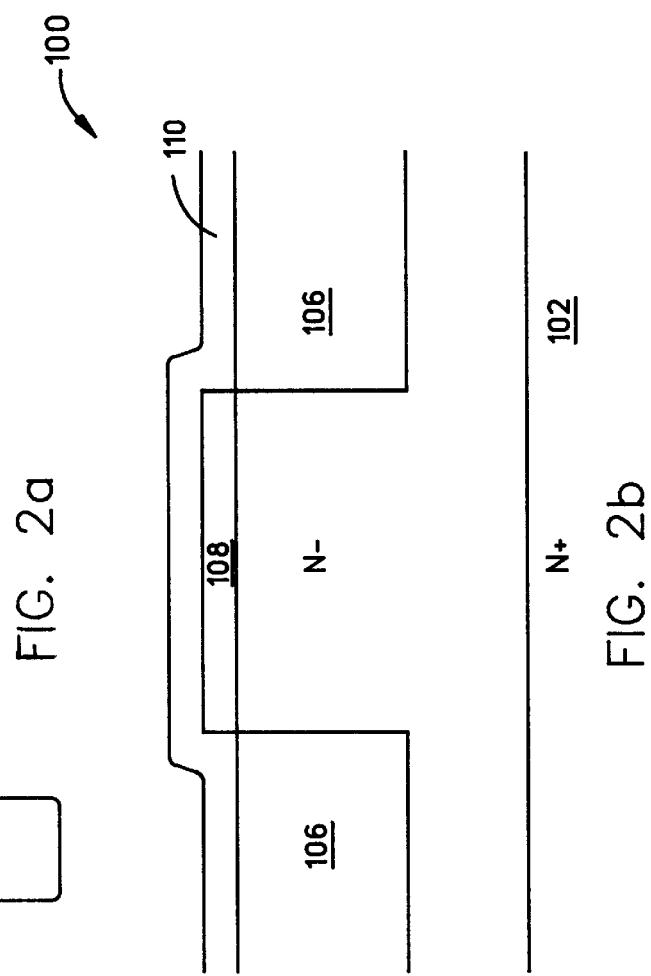

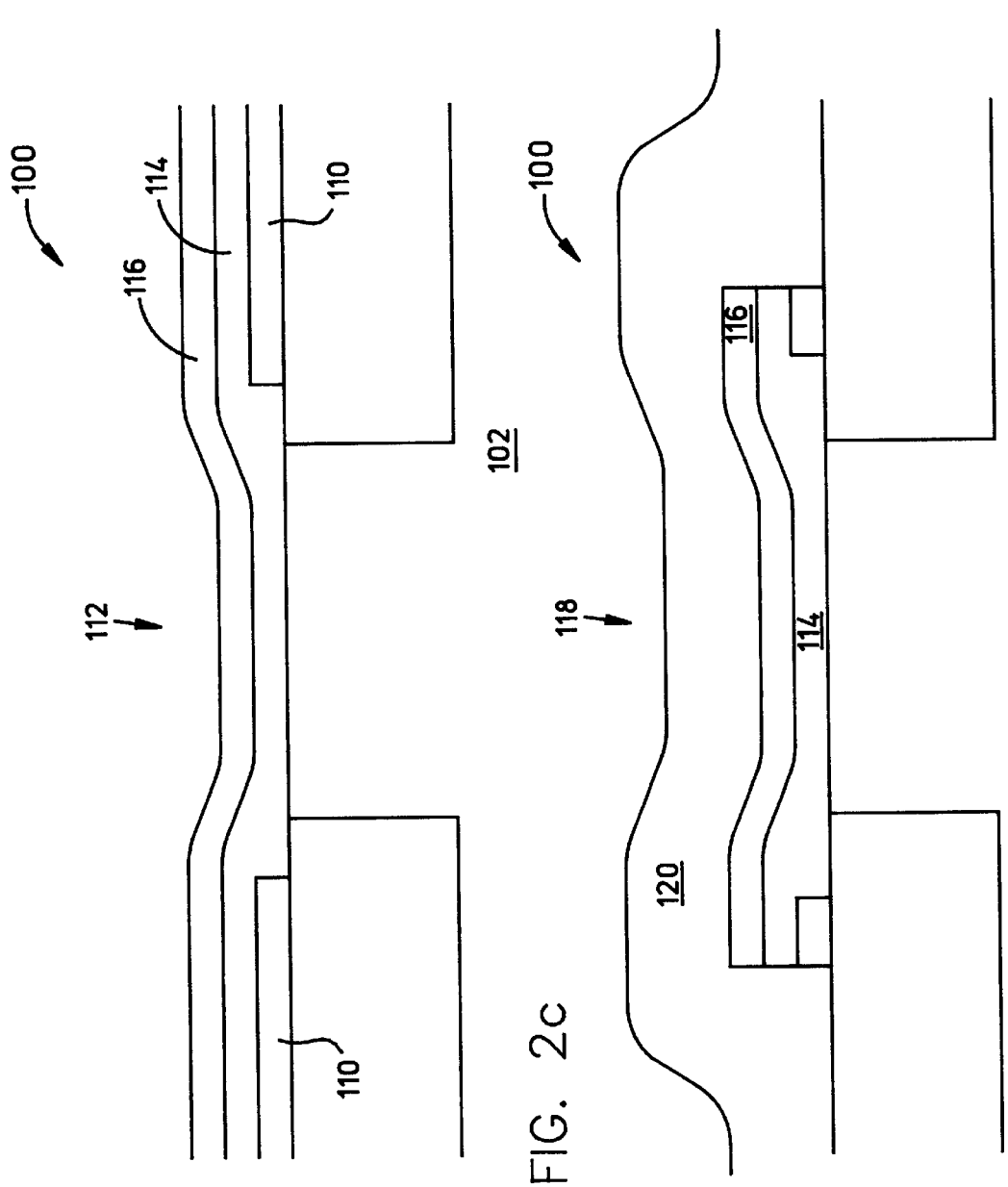

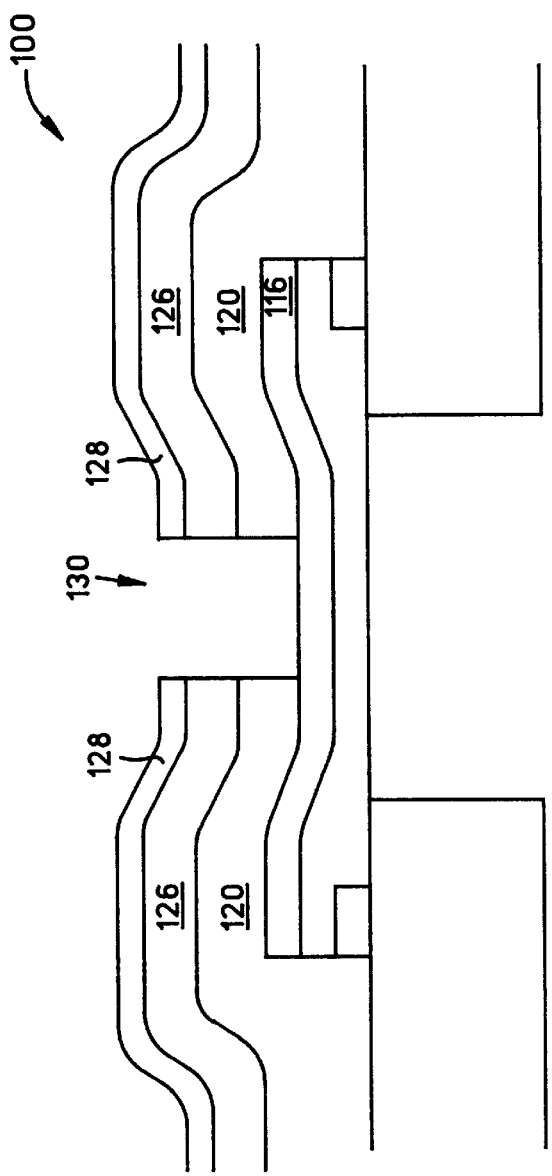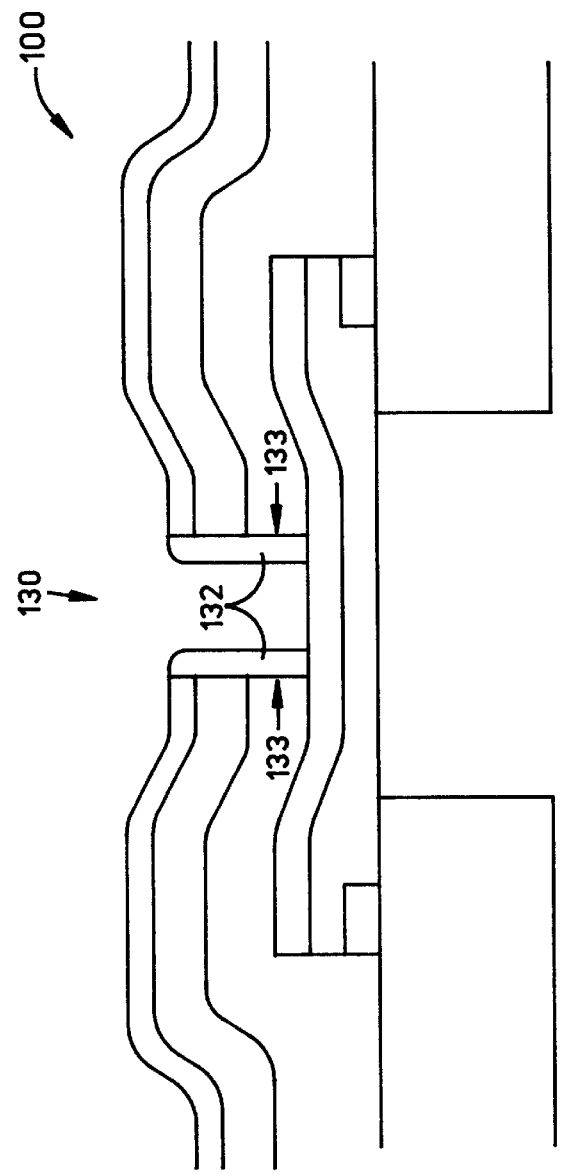
FIG. 2e
FIG. 2f

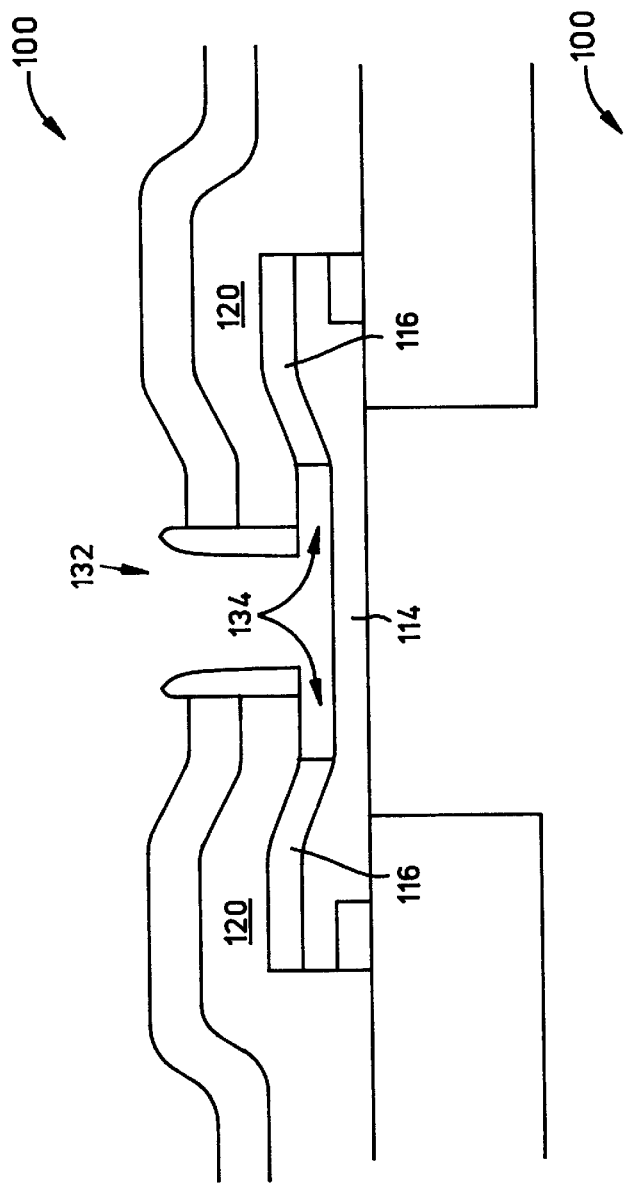
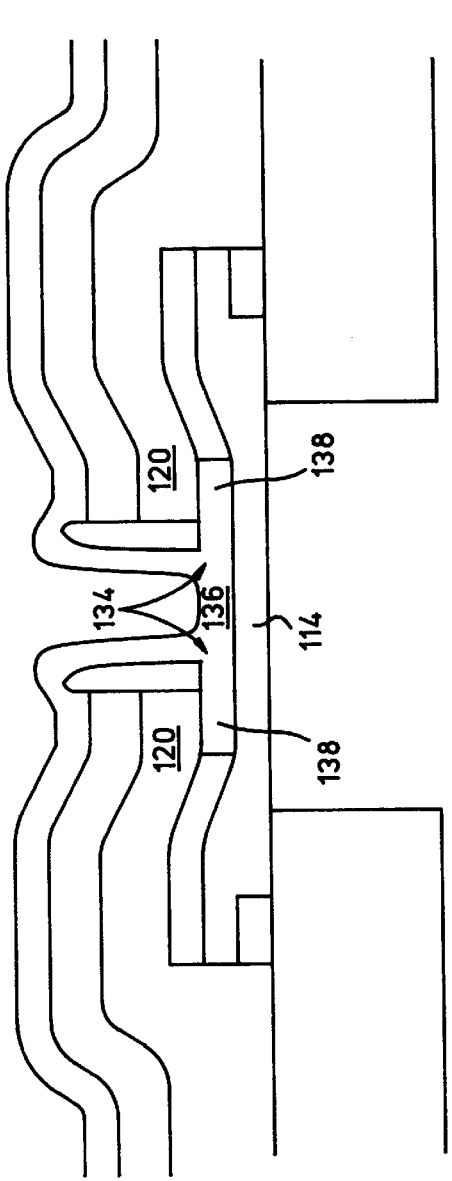
FIG. 2g
FIG. 2h

BIPOLAR DEVICE WITH SILICON GERMANIUM (SIGE) BASE REGION

This invention generally concerns high-speed bipolar devices, and in particular, a bipolar device having a silicon germanium (SiGe) base region formed in a epitaxial (EPI) reactor process.

The integration of SiGe into the silicon bipolar base processing has been of interest because of the resulting improvements in electrical properties such as transmit frequency (Ft), Early voltage (Va), and collector-to-emitter breakdown (BVceo). The band gap at the collector side can be reduced by substituting germanium (Ge) for silicon (Si) in the base region of a bipolar transistor. This results in an electric field in the base, which reduces the majority carriers transit time through the base. SiGe films can be integrated into silicon processing with much less difficulty than other materials. However, even the use of structurally similar materials creates lattice mismatches on the crystal boundary area. Further, the formation of very thin base regions is complicated by the fact that boron implantation, even at an energy as low as 5 Kev, can still penetrate 1000 Å, into the base collector junction.

Different techniques have been proposed to integrate SiGe into the base of a bipolar device. These techniques are classified into two categories: blanket SiGe film deposition and selective SiGe film deposition. The blanket SiGe deposition-method produces less silicon defects, and, therefore, higher yields. Thin, heavily doped, film can be produced with this method using growth rates of 25 to 100 Å per minute. However, blanket deposition processes are difficult to integrate into standard bipolar fabrication processes. Undesired areas of SiGe cannot easily be etched away without damaging the thin, intended base region. Alternately, selective deposition techniques can be used to form base electrode and base region underlying the emitter.

Selective deposition process can be used to grow SiGe only on silicon areas. Although selective SiGe film deposition is conceptually simple, there are additional problems associated with defect formation near the emitter-base junction.

It would be advantageous if a simple, low cost, process could be developed for the formation of SiGe base regions in a bipolar transistor.

It would be advantageous if a SiGe base region could be formed through other processes, simpler than those of selective deposition. Further, it would be advantageous if SiGe grown through an EPI reactor process could be used to form the base region of a transistor.

It would be advantageous if an emitter region and base electrode could be formed overlying a layer of blanket deposited SiGe.

Accordingly, a high-speed bipolar device is provided. The bipolar device comprises a collector region made through any conventional process. A SiGe base region overlies the collector region, formed through an EPI reactor process, to a thickness in the range of approximately 100 Å to 1000 Å. A base electrode, at least partially, overlies the SiGe base region. The emitter region partially overlies extrinsic regions of the base electrode, and is connected to intrinsic regions of the SiGe base region. A silicon contact link connects extrinsic regions of the base electrode to the SiGe base region.

A temporary first oxide spacer is initially formed between the base electrode and the SiGe base region. The silicon contact link is formed after the removal the temporary first oxide spacer.

A method for fabricating a high-speed bipolar device has also been provided. The method comprises the steps of:

forming a silicon germanium compound (SiGe) base region deposited in an EPI reactor process;

forming a base electrode having an extrinsic region underlying a subsequently formed emitter;

forming a contact link from extrinsic regions of the base electrode to the SiGe base region; and forming an emitter region overlying the SiGe base region;

A first, temporary, layer of protective oxide insulator material is formed overlying the SiGe base region. A layer of polysilicon is deposited over the first oxide layer to form the base electrode, and the first oxide layer is partially etched to form a gap between the base electrode and the SiGe base region. Silicon, or some other conductant, is isotropically deposited in the gap between the base electrode and the SiGe base region, and undesired conductant material is removed with an anisotropic process.

BRIEF DESCRIPTION OF THE DRAWINGS

FIGS. 2a–2k are partial cross-sectional views illustrating detailed steps in the completion of the high speed bipolar device of the present invention.

DETAILED DESCRIPTION OF THE PREFERRED EMBODIMENT

The present invention combines some of the advantages of blanket SiGe deposition with some of the attractive features of the selective SiGe deposition in a process to develop high-speed bipolar devices.

In following description, manufacturing steps are described with enough detail to show relationships between elements of completed device. Many fabrication details are omitted from this description, with the understanding that those skilled in the art may employ as many of those details as are called for in any particular design. Moreover, when description is given in this application of fabrication steps, those skilled in the art will realize that each such step may actually comprise one or more discrete steps and that other-steps, not described herein, may be necessary to achieve specific applications of the invention.

Figure 1A:
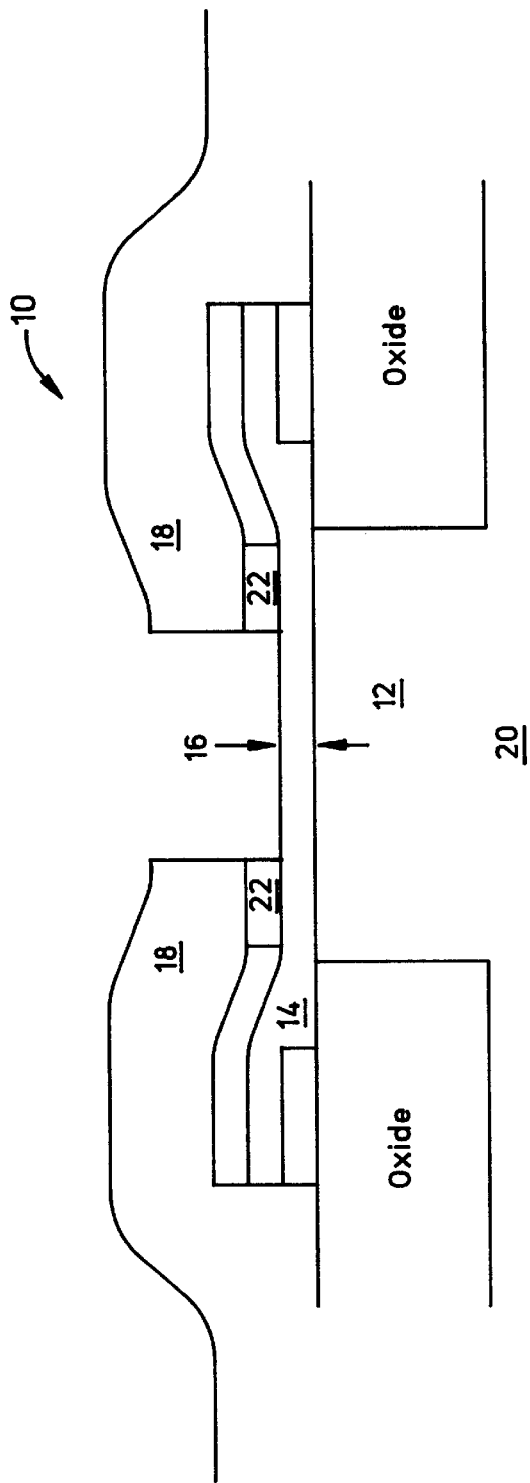
FIGS. 1a–1b illustrate a partial cross-sectional view of the high-speed bipolar device of the present invention.
Figure 1B:
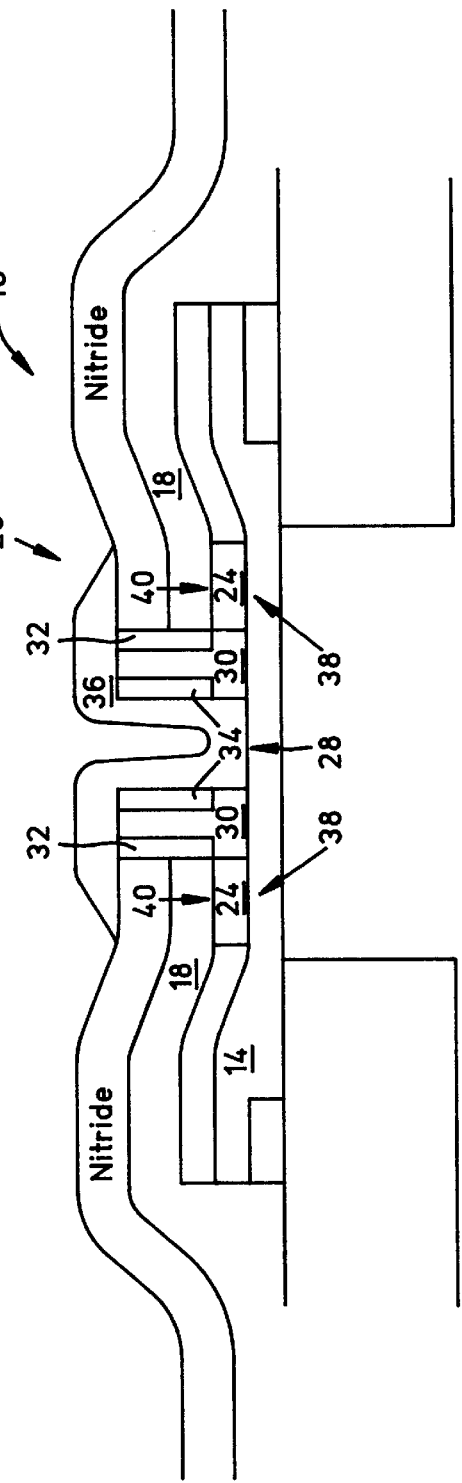

FIGS. 1a–1b illustrate a partial cross-sectional view of the high-speed bipolar device of the present invention. The bipolar device 10 has a lightly doped collector region 12, and a SiGe base region 14 overlying the collector region 12. The SiGe base region 14 is formed in an EPI reactor deposition process, as is explained in more detail, below. The SiGe base region 14 has a thickness 16 in the range of approximately 100 Å to 1000 Å. A base electrode 18, at least partially, overlies the SiGe base region 14. A heavily doped collector area 20 is also shown underlying the lightly doped collector region 12. A temporary first oxide spacer 22 is located between the base electrode 18 and the SiGe base region 14.

FIG. 1b illustrates the device 10 of FIG. 1a, following the removal of the temporary oxide spacer 22. A conductive connect link 24 connects the base electrode 18 to the SiGe base region 14. The conductive connect link 24 replaces the temporary first oxide spacer 22. The conductive contact link 24 is a material selected from the group consisting of metal, single crystal silicon, polycrystalline silicon, and amorphous silicon. When conductive connect link 24 is silicon, it is typically deposited using a CVD process.

An emitter window 26 is formed through the base electrode 18 to expose the intrinsic region 28 of the SiGe base region 14. Emitter window oxide sidewall spacers 30 overlie the first nitride sidewall spacers 32. Oxide sidewall spacers 30 are formed from selectively oxidizing the CVD silicon deposited to form conductive contact link 24. The high pressure oxidation process (HIPOX) is conducted at a low temperature, in the range of approximately 600 to 700 degrees C., and a high pressure, in the range of approximately 20 to 30 atmospheres (ATM). The process is selective because it stops short of oxidizing the conductive contact links 24, and consumes only a thin layer of the SiGe base cap material 14. Second nitride sidewall spacers 34 overlie oxide spacers 30.

An emitter 36 is formed in emitter window 26, connected to the intrinsic region 28 of the SiGe base region 14. The SiGe base region 14 also includes extrinsic regions 38 where the emitter 36 does not directly overlie and contact the SiGe base region 14. Base electrode 18 includes extrinsic regions 40 overlying extrinsic regions 38 of SiGe base region 14. Conductive contact link 24 is formed from the base electrode extrinsic regions 40 and to. the SiGe base extrinsic regions 38.

FIGS. 2a–2k are cross-sectional views illustrating detailed steps in the completion of the high-speed bipolar device of the present invention. The bipolar device 100 starts with a semiconductor substrate 102. After forming the N+ buried layer and growing an N– EPI layer, the isolation is accomplished using both deep 104 and shallow 106 trenches having deep, high aspect ratio, grooves in the silicon 102. The sidewalls of the trenches 104 are then oxidized and polysilicon is deposited to completely fill the trenches. A blanket polysilicon etch back or chemical-mechanical polishing is performed to remove the polysilicon from the wafer surface. After oxide wet etching, a thin oxide (200–500 Å) is grown and a nitride film (300 to 2000 Å) is deposited. Shallow trenches 106 are then patterned, and the shallow trench sidewalls are oxidized and nitride removed from the device areas. Plasma enhanced CVD (PECVD) oxide is deposited and planarized to expose the device areas while leaving oxide over the shallow trenches. FIGS. 2a through 2k detail the fabrication of an NPN example of the present invention. Similar processes exist for the fabrication of a present invention PNP transistor, but are not presented in the interest of brevity.

FIG. 2b illustrates the bipolar device of FIG. 2a following planarization. A thin thermal oxide 108 is grown to a thickness of approximately 50 to 300 Å and a polysilicon layer 110 is deposited to a thickness of approximately 500 Å to 1500 Å on the substrate 102.

FIG. 2c illustrates the bipolar device of FIG. 2b following patterning. A window 112 is patterned over the active area, exposing the substrate 102, where the base and emitter are subsequently formed. The polysilicon 110 and oxide 108 layers in the window 112 are etched, and resist stripped. Oxide layer 108 is not shown because it has been completely removed (see FIG. 2b). Following a quick 10:1 (DI:HF) etch, where HF is hydrofluoric acid solution, a SiGe base EPI layer 114 is grown on the substrate 102 in the window 112 area and on the polysilicon 110. The physical properties of this film, such as thickness, Germanium content and profile, Boron doping level, and location in relation to the Germanium, are extremely important in determining the final electrical properties of the device. As is well known, the EPI deposition process deposits a bottom layer of silicon, followed by a layer of SiGe, and a top layer of Si. The sub-layers of the EPI SiGe layer 114 are not shown. A thin protection oxide layer 116 is grown, typically through high pressure low temperature oxidation (HIPOX), or deposited using plasma enhanced CVD (PECVD) processes on the SiGe base EPI layer 114.

FIG. 2d illustrates the bipolar device of FIG. 2c following base area patterning. The base area is patterned and the oxide 116 and polysilicon layer 110 etched away outside, of the pattern area 118. A polysilicon layer 120 is then deposited to a thickness of approximately 1500 to 2500 Å and implanted with boron.

FIG. 2e illustrates the bipolar device 100 of FIG. 2d following emitter window patterning. A PECVD nitride layer 126 of approximately 2500 to 4000 Å, and oxide layer 128 of approximately 500 to 1500 Å, are deposited on the polysilicon layer 120. A well or emitter window 130 is patterned and the oxide 128/nitride 126/polysilicon 120 sandwich is etched, exposing the protective oxide layer 116 at the bottom of the well. Alternately, the oxide layer 128 can be omitted, depending on the type of equipment used and the endpoint selected during etching.

FIG. 2f illustrates the bipolar device of FIG. 2e following a nitride deposition. After resist strip, a layer of PECVD nitride is deposited over the structure and etched back to form nitride spacers 132. The nitride spacers 132 protect the exposed polysilicon. side walls 133 in the emitter window 130 from oxidation.

FIG. 2g illustrates the bipolar device 100 of FIG. 2f following an oxide etch. Following formation of the nitride spacers 132, the exposed protection oxide layer 116 in the emitter window 132 is etched away in a diluted HF solution. Also etched away is a portion of the protection oxide layer 116 between the polysilicon layer 120 and SiGe base Epi layer 114, forming gaps 134. The etching of the gaps 134 is very critical in that it controls the size of the contact region that will be formed between the polysilicon layer 120 and the SiGe base layer 114. The diluted HF solution also etches away the oxide layer 128 (see FIG. 2f).

FIG. 2h illustrates the bipolar device of FIG. 2g following a silicon deposition. A thin layer of polysilicon 136 is deposited over the structure and fills the gaps 134 between the polysilicon layer 120 and SiGe base layer 114, creating a polysilicon-to-SiGe contact region 138 between the polysilicon layer 120 and SiGe base layer 114. Alternative contact materials 136, instead of polysilicon, include selective silicon epitaxial growth, selective polysilicon-germanium film, combination of a seed polysilicon followed by high temperature silicon, or selective tungsten deposition.

Figure 2I:
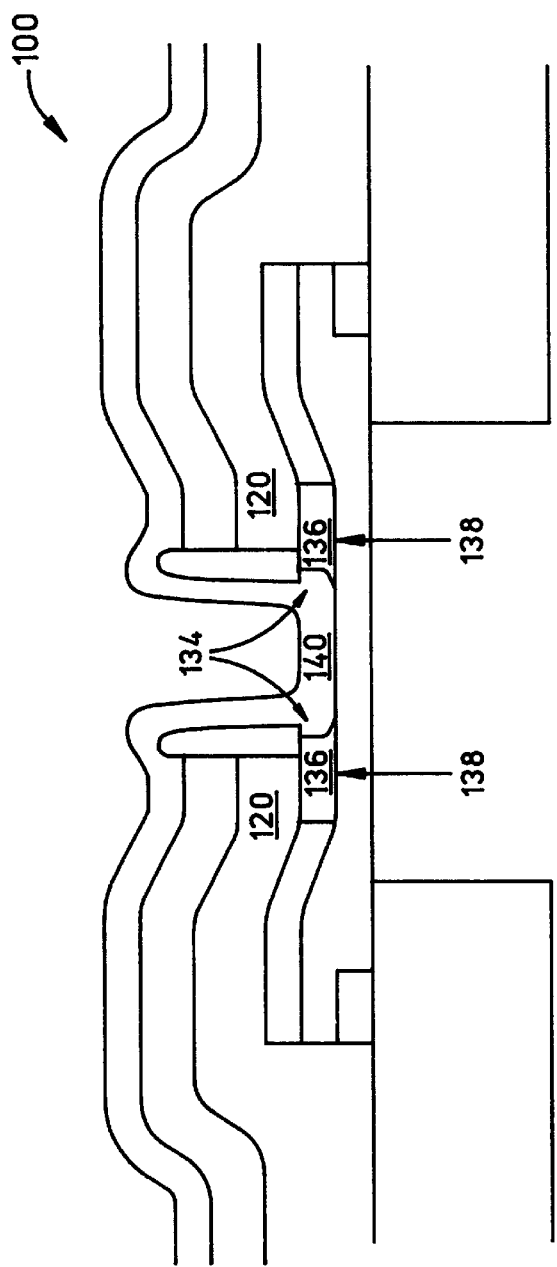

FIG. 2i illustrates the bipolar device 100 of FIG. 2h. following the oxidation of silicon layer 136. A high-pressure (20–30 ATM), low temperature (600–725 degree C.) oxidation is performed to consume the polysilicon 136 outside of the gaps 134, forming an oxide 140 in all areas except the polysilicon-to-SiGe contact region 138. In the case of a tungsten contact matenral 136, a highly directional plasma etch is used to remove the tungsten from the emitter window overlying the base extrinsic region, leaving conductive contact link 138 in place.

Figure 2J:
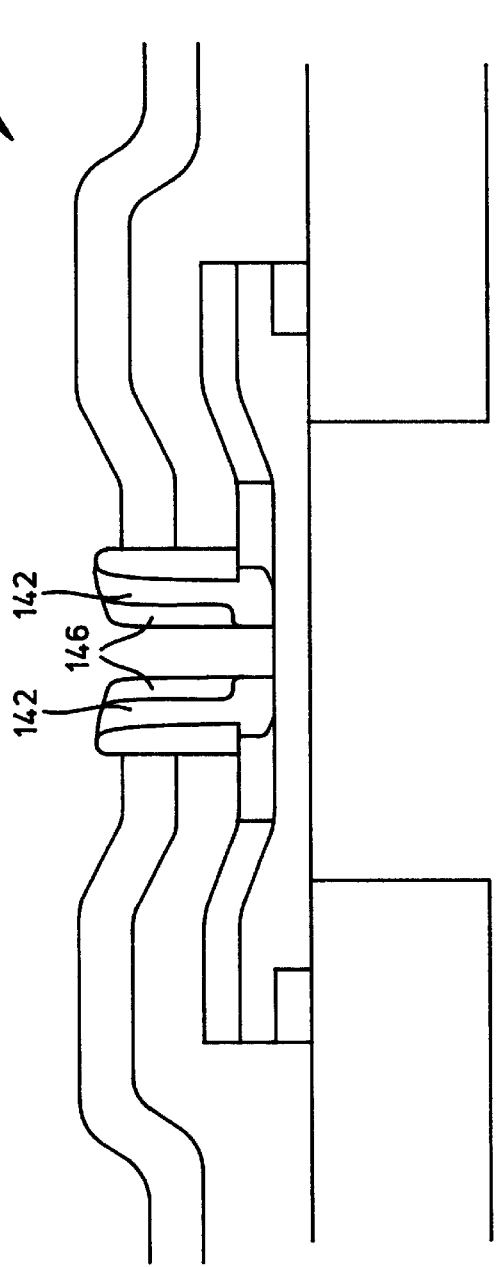

FIG. 2j illustrates the bipolar device 100 of FIG. 2i following an oxide etch. Spacers 142 are then formed by PECVD oxide deposition to a thickness of approximately 1500 to 4000 Å, and etched back using a plasma etch process. Alternately, a PECVD nitride/silicon layer (not shown) with a thickness of approximately 300 to 1200 Å and 2500 to 4000 Å, respectively, is deposited and etched back. A nitride deposition and etch back creates nitride sidewall spacers 146.

Figure 2K:
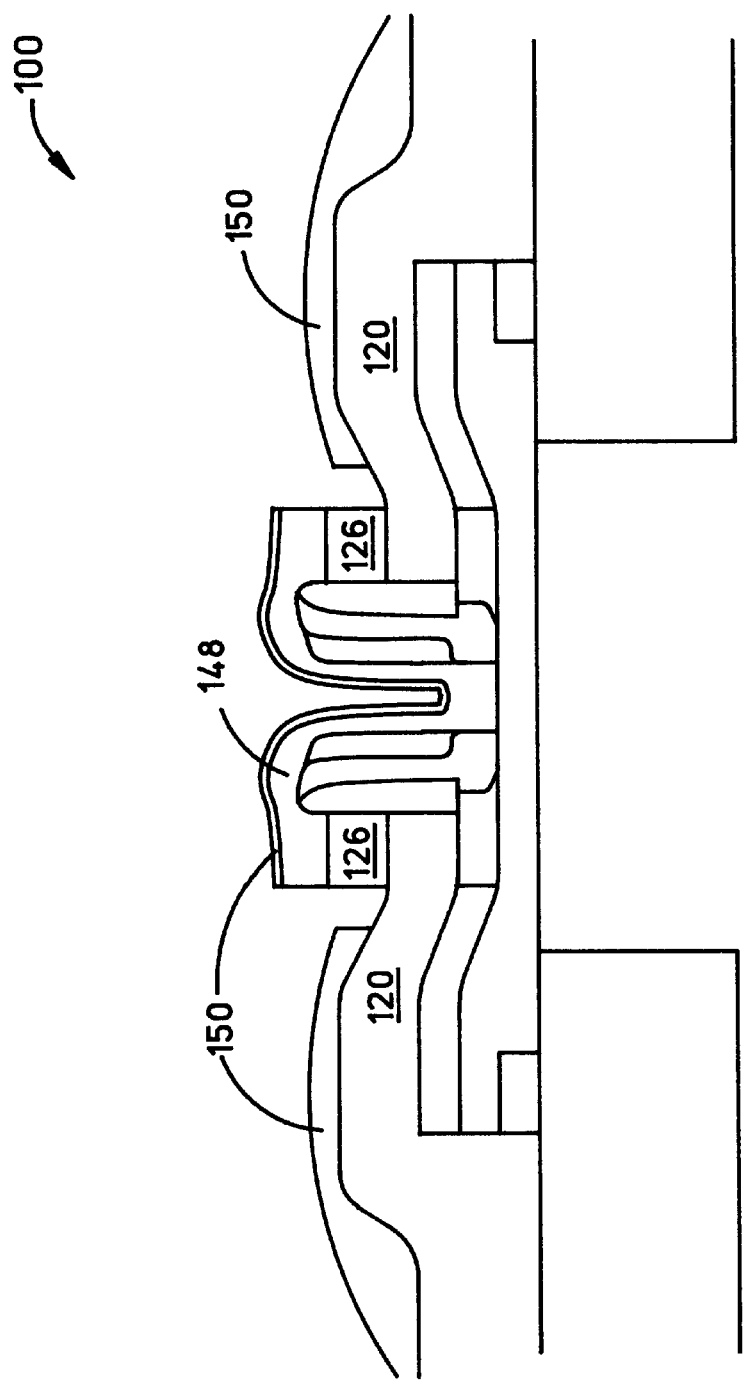

FIG. 2k illustrates the bipolar device 100 of FIG. 2j following the formation of the emitter. A quick diluted HF dip, followed by emitter polysilicon deposition 148 and an arsenic implant are performed, followed by furnace annealing at a temperature of 675 to 750 degrees C.

The polysilicon emitter 148 is patterned, followed by a short (10 to 20 sec) rapid thermal annealing at a temperature of 900 to 1000 degrees C. The next process steps consist of patterning the silicide windows, and etching the nitride layer 126 down to the polysilicon layer 120. This is followed by platinum deposition and furnace silicide formation 150. The non-reacted platinum is etched away in a wet solution.

Figure 3:
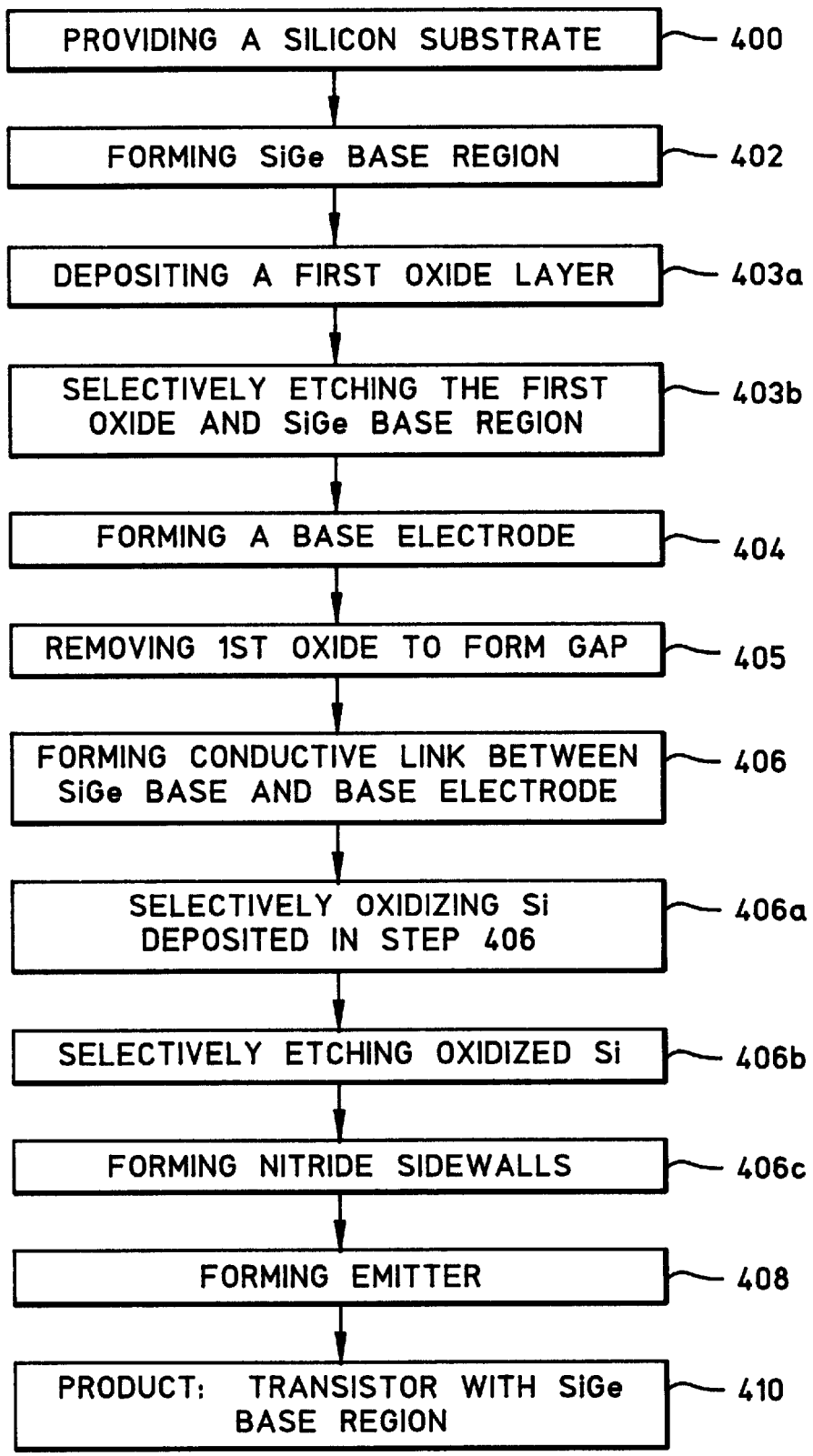
FIG. 3 is a flowchart illustrating steps in a method for fabricating a high-speed bipolar device of the present invention.

FIG. 3 is a flowchart illustrating steps in a method for fabricating a high-speed bipolar device of the present invention. Step 400 provides a silicon substrate. Step 402 forms a silicon germanium compound (SiGe) base region. The SiGe base region is typically formed to a thickness in the range of approximately 100 to 1000 Å. Step 404 forms a base electrode. Step 406 forms a conductive contact link from the base electrode to the SiGe base region. Step 408 forms an emitter region overlying the SiGe-base region. Step 410 is a product, where the transistor response is improved by forming a thin SiGe base region between the emitter and collector.

Step 402 includes. forming extrinsic regions of the SiGe base region, not directly connected to the emitter, and Step 404 includes forming extrinsic regions of base electrode underlying the emitter region, and overlying extrinsic regions of the SiGe base region. Then, Step 406 includes forming the conductive contact link from extrinsic regions of the base electrode to extrinsic regions of the SiGe base region.

Typically, Step 400 provides a lightly doped silicon collector region, and Step 402 includes sub-steps for isotropically depositing a SiGe layer in an epitaxial (EPI) reactor process. Step 402a (not shown) deposits a silicon bottom layer overlying the collector region, Step 402b (not shown) deposits a layer of SiGe overlying the silicon bottom layer, Step 402c (not shown) deposits a silicon cap layer overlying the SiGe layer.

In some aspects of the invention further steps follow Step 402. Step 403a deposits a first layer of protective oxide-insulator material overlying the SiGe base region. Step 403b selectively etches the SiGe and first oxide layer, leaving the SiGe base region and first oxide layer overlying the collector region. Step 404 deposits a layer of silicon overlying the first oxide layer to form the base electrode. Then, a further step follows Step 404. Step 405 removing the first oxide layer, at least partially, to form a gap between the base electrode and the SiGe base region.

Step 405 can be broken down into a series of sub-steps, not shown. Step 405a deposits a first nitride layer overlying the polysilicon base electrode. Step 405b deposits a second oxide layer overlying the first nitride layer. Step 405c selectively etches the second oxide layer, first nitride layer, and the base electrode, forming an emitter window, with sidewalls, and exposing the first oxide layer overlying the SiGe base region. Step 405d forms nitride sidewall spacers over the emitter window sidewall formed in Step 405c. Step 405e etches to remove the second oxide layer and selectively etches the first oxide layer to form the gap between the SiGe base region and the base electrode.

In some aspects of the invention, sub-Step 405e includes etching the first oxide layer exposed in sub-step 405c, and continuing the etching process to remove the first oxide layer underlying the base electrode, creating a gap between the base electrode and the SiGe base region.

Step 406 includes depositing a conductive material selected from the group consisting of metal, single crystal silicon, polycrystalline, and amorphous silicon, to fill the gap between the base electrode and the SiGe base region formed in Step 405e. When Step 406 deposits silicon, the silicon is deposited through chemical vapor deposition (CVD). Then a further step following Step 406. Step 406a selectively oxidizes the silicon deposited in Step 406, at a pressure in the range of approximately 20 to 30 atmospheres (ATM), and at a temperature in the range of approximately 600 to 700 degrees C., where the selective oxidation process does not oxidize the silicon contact links formed in the gap between the base electrode and the SiGe base region. Step 406b selectively etches the silicon oxidized in Step 406a, exposing the intrinsic SiGe base region in the bottom of the emitter window, but leaving oxidized silicon sidewall spacers. Step 406c forms nitride sidewall spacers overlying the oxide sidewall spacers.

Alternately, Step 406 includes depositing metal on the SiGe base region, and includes a further step following Step 406, which is not shown. However, this additional step would involve plasma etching to remove the metal from the exposed, intrinsic region of the SiGe base.

While only certain preferred features of this invention have been shown by way of illustration, many changes and modifications will occur to those skilled in the art. Accordingly, it is to be understood that the appended claims are intended to cover all such modifications and changes as fall within the true spirit and scope of the invention.

What is claimed is:

1. A method for fabricating a high-speed bipolar device comprising the steps of:
    a) isotropically forming a silicon germanium compound (SiGe) base region using an epitaxial (EPI) reactor process comprising:
        aa) depositing a silicon bottom layer overlying the collector region;
        ab) depositing a layer of SiGe overlying the silicon bottom layer; and
        ac) depositing a silicon cap layer overlying the SiGe layer;
    b) forming a first oxide layer on the SiGe base region;
    c) forming a base electrode on the first oxide layer;
    d) forming a conductive contact link from the base electrode to the SiGe base region;
    e) forming an emitter region overlying the SiGe base region; and
    f) providing a lightly doped silicon collector region.

2. The method of claim 1 in which Step a) includes forming extrinsic regions of the SiGe base region, not directly connected to the emitter region, in which Step b) includes forming extrinsic regions of the base electrode, and in which Step d) includes forming the conductive contact link from extrinsic regions of the base electrode to extrinsic regions of the SiGe base region.

3. The method of claim 1 including the further step, following Step a), of:
    a1) selectively etching the SiGe base region and the first oxide layer, leaving the SiGe base region and the first oxide layer overlying the collector region.

4. The method of claim 3 in which Step c) includes depositing a layer of silicon overlying the first oxide layer to form the base electrode, and including a further step, following Step c), of:

c1) removing the first oxide layer, at least partially, to form a gap between the base electrode and the SiGe base region.

5. The method of claim 4 in which Step c1) includes sub-steps as follows:

c1a) depositing a first nitride layer overlying the base electrode;

c1b) depositing a second oxide layer overlying the first nitride layer;

c1c) selectively etching the second oxide layer, first nitride layer, and the base electrode, forming an emitter window, with sidewalls, and exposing the first oxide layer overlying the SiGe base region;

c1d) forming nitride sidewall spacers over the emitter window sidewall formed in Step c1c); and c1e) etching to remove the second oxide layer and selectively etching the first oxide layer to form the gap between the SiGe base region and the base electrode.

6. The method of claim 5 in which sub-Step c1e) includes etching the first oxide layer exposed in sub-step c1c), and continuing the etching process to remove the first oxide layer underlying the base electrode, creating a gap between the base electrode and the SiGe base region.

7. The method of claim 6 in which Step d) includes depositing a conductive material selected from the group consisting of metal, single crystal silicon, polycrystalline, and amorphous silicon, to fill the gap between the base electrode and the SiGe base region formed in Step c1e).

8. The method of claim 7 in which Step d) includes depositing silicon through chemical vapor deposition (CVD).

9. The method of claim 8 including a further step, following Step d), of:

d1) selectively oxidizing the silicon deposited in Step d) at a pressure in the range of approximately 20 to 30 atmospheres (ATM) and a temperature in the range of approximately 600 to 700 degrees C., where the selective oxidation process does not oxidize the silicon contact links formed in the gap between the base electrode and the SiGe base region.

10. The method of claim 9 including the further steps, following Step d1), of:

d2) selectively etching the silicon oxidized in Step d1), exposing an intrinsic SiGe base region in the bottom of the emitter window, but leaving oxidized silicon sidewall spacers; and d3) forming nitride sidewall spacers overlying the oxide sidewall spacers.

11. The method of claim 10 in which Step d) includes depositing the metal on the SiGe base region, and including a further step, following Step d), of:

d4) plasma etching to remove the metal from the exposed, intrinsic region of the SiGe base region.

12. The method of claim 1 in which Step a) includes forming the SiGe base region to a thickness in the range of approximately 100 to 1000 Å.

13. A method for manufacturing a high speed bipolar device comprising:

forming a silicon germanium (SiGe) base region overlying a collector region of a silicon substrate;

depositing an oxide layer on the SiGe base region;

depositing a base electrode layer on the oxide layer;

etching an emitter window in the base electrode layer, the emitter window terminating at an exposed portion of the oxide layer;

etching at least the exposed portion of the oxide layer to form gaps between the base electrode layer and the SiGe base region; and filling the gaps with an electrode contact material to form conductive contact links from the base electrode layer to the SiGe base region.

14. A method according to claim 13, wherein said base electrode layer is formed from polysilicon.

15. A method according to claim 13, wherein said electrode contact material is polysilicon.

* * * * *

UNITED STATES PATENT AND TRADEMARK OFFICE
CERTIFICATE OF CORRECTION

| | |
|---|---|
| PATENT NO. | : 6,559,020 B1 |
| APPLICATION NO. | : 09/421957 |
| DATED | : May 6, 2003 |
| INVENTOR(S) | : Abderrahmane Salmi |

It is certified that error appears in the above-identified patent and that said Letters Patent is hereby corrected as shown below:

Title Page; item (75);

On page 1 of the patent, please add the name of Cengiz Ozkan as the second inventor. The first page of the patent should read as follows:

Inventors:     Abderrahmane Salmi, Temecula, CA (US) and Cengiz Ozkan, San Diego, CA (US)

Signed and Sealed this

Twelfth Day of August, 2008

JON W. DUDAS
*Director of the United States Patent and Trademark Office*